US007174339B1

(12) United States Patent
Wucherer et al.

(10) Patent No.: US 7,174,339 B1
(45) Date of Patent: Feb. 6, 2007

(54) INTEGRATED BUSINESS SYSTEM FOR THE DESIGN, EXECUTION, AND MANAGEMENT OF PROJECTS

(75) Inventors: Tom Wucherer, Las Vegas, NV (US);
Todd Nisbet, Las Vegas, NV (US);
Cherisse M. Nicastro, Phoenix, AZ (US); Anthony A. Marnell, II, Las Vegas, NV (US)

(73) Assignee: Tririga LLC, Las Vegas, NV (US)

( * ) Notice: Subject to any disclaimer, the term of this patent is extended or adjusted under 35 U.S.C. 154(b) by 0 days.

(21) Appl. No.: 09/519,935

(22) Filed: Mar. 7, 2000

(51) Int. Cl.
*G06F 17/00* (2006.01)

(52) U.S. Cl. .................... 707/102; 707/101; 707/104.1

(58) Field of Classification Search .................... 707/1, 707/10, 102, 202, 505, 104.1, 103 R; 709/203, 709/220, 217; 705/30; 714/15
See application file for complete search history.

(56) References Cited

U.S. PATENT DOCUMENTS

| | | | |
|---|---|---|---|
| 4,578,768 A | 3/1986 | Racine | 364/560 |
| 4,700,318 A | 10/1987 | Ockman | |
| 4,799,156 A | 1/1989 | Shavit et al. | |
| 4,870,576 A | 9/1989 | Tornetta | |
| 4,970,666 A | 11/1990 | Welsh et al. | 364/522 |
| 4,972,318 A | 11/1990 | Brown et al. | |
| 4,992,940 A | 2/1991 | Dworkin | |
| 5,189,606 A | 2/1993 | Burns et al. | |
| 5,303,144 A | 4/1994 | Kawashima et al. | |
| 5,434,994 A | 7/1995 | Shaheen et al. | |
| 5,526,520 A | 6/1996 | Krause | |
| 5,528,490 A | 6/1996 | Hill | |
| 5,655,118 A | 8/1997 | Heindel et al. | |
| 5,666,493 A | 9/1997 | Wojcik et al. | |

(Continued)

FOREIGN PATENT DOCUMENTS

EP 0 959 421 A 11/1999

(Continued)

OTHER PUBLICATIONS http://www.fedcenter.com printed May 22, 2000.

(Continued)

*Primary Examiner*—Sana Al-Hashemi
(74) *Attorney, Agent, or Firm*—Vierra Magen Marcus & DeNiro LLP

(57) ABSTRACT

The system of method for building a database for the design and execution of projects is described. This system includes a host computer system in data communication with a central database and at least first and second databases. The central data base stores information relating to the design and execution of the project predetermined to be important to one or more project team members. The first and second databases are in communication with first and second computer systems which may be remotely located from each other and which execute standard industry software tools. The host computer system is configured to monitor a plurality of transactions to the first database. Each of the plurality of transactions stores data in the first database. The monitoring includes comparing the plurality of a transaction against a predetermined transaction. If the host computer detects a match between one of the plurality of transactions and the predetermined transaction, the host computer reads the first data stored in the first database by the matched transaction and stores the first data in either the second database or the central database, or both. Additionally, the host computer system generates a message indicating that the first database was updated with the first data. This message is then transmitted to the second computer system.

6 Claims, 8 Drawing Sheets

U.S. PATENT DOCUMENTS

| | | | |
|---|---|---|---|
| 5,668,736 A | 9/1997 | Douglas et al. | |
| 5,689,705 A | 11/1997 | Fino et al. | |
| 5,694,551 A | 12/1997 | Doyle et al. | |
| 5,710,887 A | 1/1998 | Chelliah et al. | |
| 5,715,314 A | 2/1998 | Payne et al. | |
| 5,742,931 A | 4/1998 | Spiegelhoff et al. | |
| 5,754,850 A | 5/1998 | Janssen | |
| 5,755,072 A | 5/1998 | Lingafelter | |
| 5,758,327 A | 5/1998 | Gardner et al. | |
| 5,758,328 A | 5/1998 | Giovannoli | |
| 5,761,674 A | 6/1998 | Ito | |
| 5,765,142 A | 6/1998 | Allred et al. | |
| 5,768,142 A | 6/1998 | Jacobs | |
| 5,793,632 A | 8/1998 | Fad et al. | |
| 5,799,286 A | 8/1998 | Morgan et al. | |
| 5,799,318 A | 8/1998 | Cardinal et al. | |
| 5,815,829 A | 9/1998 | Zargar | |
| 5,826,252 A | 10/1998 | Wolters, Jr. et al. | |
| 5,832,494 A | 11/1998 | Egger et al. | 707/102 |
| 5,842,178 A | 11/1998 | Giovannoli | |
| 5,847,971 A | 12/1998 | Ladner et al. | |
| 5,848,410 A | 12/1998 | Walls et al. | 707/4 |
| 5,859,847 A | 1/1999 | Dew et al. | 370/389 |
| 5,873,076 A | 2/1999 | Barr et al. | |
| 5,875,110 A | 2/1999 | Jacobs | |
| 5,893,082 A | 4/1999 | McCormick | |
| 5,895,454 A | 4/1999 | Harrington | |
| 5,899,980 A | 5/1999 | Wilf et al. | |
| 5,899,990 A | 5/1999 | Maritzen et al. | 707/4 |
| 5,903,877 A | 5/1999 | Berkowitz et al. | |
| 5,918,227 A | 6/1999 | Polnerow et al. | 707/10 |
| 5,924,094 A | 7/1999 | Sutter | |
| 5,926,798 A | 7/1999 | Carter | |
| 5,931,907 A * | 8/1999 | Davies et al. | 709/218 |
| 5,932,459 A | 8/1999 | Sittinger et al. | |
| 5,940,820 A | 8/1999 | Kagiwada | 707/3 |
| 5,946,665 A | 8/1999 | Suzuki et al. | |
| 5,950,173 A | 9/1999 | Perkowski | |
| 5,950,206 A * | 9/1999 | Krause | 707/104.1 |
| 5,956,709 A | 9/1999 | Xue | |
| 5,970,472 A | 10/1999 | Allsop et al. | |
| 5,970,475 A | 10/1999 | Barnes et al. | |
| 5,970,490 A | 10/1999 | Morgenstern | |
| 5,974,395 A | 10/1999 | Bellini et al. | |
| 5,983,010 A | 11/1999 | Murdock et al. | |
| 5,991,535 A * | 11/1999 | Fowlow et al. | 717/107 |
| 5,999,915 A | 12/1999 | Nahan et al. | |
| 6,002,855 A | 12/1999 | Ladner et al. | |
| 6,003,039 A | 12/1999 | Barry et al. | 707/103 |
| 6,009,413 A | 12/1999 | Webber et al. | |
| 6,012,066 A | 1/2000 | Discount et al. | |
| 6,014,644 A | 1/2000 | Erickson | |
| 6,026,376 A | 2/2000 | Kenney | |
| 6,029,174 A | 2/2000 | Sprenger et al. | |
| 6,035,293 A | 3/2000 | Lantz et al. | |
| 6,037,945 A | 3/2000 | Loveland | |
| 6,038,547 A | 3/2000 | Casto | |
| 6,044,205 A | 3/2000 | Reed et al. | 395/200.31 |
| 6,044,382 A | 3/2000 | Martino | 707/505 |
| 6,047,290 A | 4/2000 | Kennedy et al. | |
| 6,056,556 A * | 5/2000 | Braun et al. | 434/323 |
| 6,064,982 A | 5/2000 | Puri | |
| 6,363,362 B1 * | 3/2002 | Burfield et al. | 705/40 |
| 2001/0027389 A1 * | 10/2001 | Beverina et al. | 703/22 |
| 2002/0174010 A1 * | 11/2002 | Rice | 705/14 |

FOREIGN PATENT DOCUMENTS

| | | |
|---|---|---|
| JP | 07271569 A | 10/1995 |
| WO | WO 98 38564 A | 9/1998 |
| WO | WO 98 43155 A | 10/1998 |
| WO | WO 99 33007 A | 7/1999 |
| WO | WO 01 63449 A | 8/2001 |
| WO | WO 01 67279 A | 9/2001 |

OTHER PUBLICATIONS http://www.rent.net printed May 22, 2000.
http://www.apartments.com printed May 22, 2000.
http://www.us.buy.com printed May 22, 2000.
http://www.designmanager.com printed Mar. 6, 2002.
Thomas A. Wucherer, "An Architectural Design Program Computer Data Base" Dec. 1987.
Tom Field, "Reengineering the Engineering Business", CIO Magazine Feb. 1, 1998.
P. Kristoff, et al., "The Process Specification System for MMST", IEEE Transactions of Semiconductor Manufacturing, vol. 8, No. 3, Aug. 1995, pp. 262-271.
J. McGee, et al., "The MMST Computer-Integrated Manufacturing System Framework", IEEE Transactions on Semiconductor Manufacturing, vol. 7, No. 2, May 1994, pp. 107-116.
T-K Peng, et al., "A Step Toward STEP-Compatible Engineering Data Management: The Data Models of Product Structure And Engineeging Changes", Robotics and Computer Integrat Manufacturing, vol. 14, No. 2, Apr. 1, 1998, pp. 89-109.
Hori, et al., "OpenMES: Scalable Manufacturing Execution Framework Based On Distributed Object Computing", Systems, Man and Cybernetics, 1999, IEEE SMC '99 Conf. Proceedings 1999 IEEE Int'l Conf., Tokyo, Japan, Oct. 12-15, 1999, pp. 398-403.
Field, Tom, "Reeingineering the Engineering Business," http://www.cio.com/archive/020198_black_content.html; Jun. 19, 2000, 6 pages.

* cited by examiner

| Transaction | Enabled |
|---|---|
| Trans 1 | Y |
| Trans 2 | N |
| Trans 3 | Y |
| Trans 4 | Y |
| Trans 5 | Y |
| ⋮ | |
| Trans X | N |

FIG. 7

INTEGRATED BUSINESS SYSTEM FOR THE DESIGN, EXECUTION, AND MANAGEMENT OF PROJECTS

BACKGROUND OF THE INVENTION

1. Field of the Invention

The present invention relates to a system for designing, constructing and managing the construction of a physical entity such as a building. More specifically, the present invention relates to a system that facilitates a real time project database in data communication with several industry available software tools used in the design, execution and management of a physical entity such as a building.

2. Description of the Related Art

Many industries employ a team of players to design and execute a project. For example, the construction industry employs a team of players to design and construct a building, such as an office building, a hotel/casino, or a manufacturing facility. Typically, the project team includes architects who prepare architectural drawings and specifications of the project according to a developer's direction. The team also includes engineers who are responsible for building systems such as structural, power, heating, cooling, plumbing systems, etc., and interior designers who are responsible for specifications relevant to interior design such as the selection and placement of furniture, paint selection, wall coverings, fixtures, office equipment, systems, etc. The team's contractor implements the designs of the architects, engineers, and interior designers, and is generally responsible for the purchase of materials, electrical systems, mechanical systems, life safety systems, furniture, fixtures, etc., the management of the project budget, and for the management of any or all subcontractors who implement the design drawings and specifications. Finally, project accountants are responsible for payment of goods and services.

In the past, the design and construction of a project involved the transfer of a substantial amount of paper between the various team members. For example, the architect may prepare initial paper specifications and drawings (i.e., blueprints) for a building project. These paper specifications and drawings, in turn, may be provided to one or more additional architectural engineers for modification or approval. The chief architect must provide his paper design specifications and drawings, typically via overnight delivery, to one or more of the collaborating firms. These additional team members typically add components or make modifications to the initial architectural drawings and specifications. Once revision is completed, the collaborating firms return the revised architectural specification and drawings to the architect so that he may compile a master set of building specifications and drawings. Several different, further revisions may occur between the architect and the other project team engineers before the final set of master architectural specifications and drawings is created.

The architectural specifications and drawings, once completed, are also provided to interior designers for input with respect to interior design features such as furniture, wall coverings, paint selection, office equipment, etc. In that each item added to a construction project, including furniture, fixtures, and equipment, typically generates more paper specifications, the interior designers additionally generate a substantial amount of paper that must be properly cataloged and distributed to other project team members. At any point during the project, revisions to the original architectural design specifications and drawings may occur which, in turn, may complicate the specifications of the interior designers and/or collaborating engineers.

Ultimately, the interior design specifications along with the architectural and engineering design specifications and/or drawings are provided to a contractor who, in accordance with the specifications and drawings, coordinates subcontractors, purchasing agents, etc., to purchase the raw materials, electrical systems, mechanical systems, life safety systems, building equipment, labor, fixtures, etc. and facilitates construction management of the project. Construction management or finance team members are responsible for maintaining the budget of the construction project, and must have current, accurate information relating to costs of materials, fixtures, labor, etc. Additionally, accountants pay project invoices and track the project's accounting commitments. At any point, an owner, architect, engineer, interior designer, or contractor may propose modifications to the project that necessitate further, hurried paper transfer amongst the team members to insure that all are working with the same information.

Computer implemented systems have streamlined many manufacturing processes. In the architecture, engineering, and construction industry, software systems have been developed which aid each team member (specific to each team member's position) in the development of a construction project. For example, computer aided design tools have been developed which enable an architect or interior designer to model a design project in a database. These computer aided design tools allow more efficient modifications to an existing design than the prior art method of employing blueprints in which changes were entered by hand. Accounting systems are also available which enable the paperless financial management of a construction project. Additionally, software systems are available to contractors to facilitate the necessary purchases, scheduling and management of a construction project.

While these existing architecture, engineering and construction software systems aid individual construction project team members, communication between the various team members remains as inefficient as in the past. In other words, an architect can make revisions to the architectural specifications of a project by accessing and modifying an existing project database. The architect has no need to generate a hard-copy of the architectural drawings and hand-enter revisions thereto. However, the architect must still communicate with the interior designer, contractor, finance team members, etc., via the old method of printing out and hastily distributing (usually numerous) architectural drawings. This is especially true when project team members wish to modify architectural specifications.

SUMMARY OF THE INVENTION

The present invention provides various embodiments for a method and system, which builds a central database of data relating to the design and construction of a physical entity such as a building. The system enables remotely positioned computer systems executing distinct industry software tools to store or modify design and project information contained in the central database. Additionally, the system allows communication between the various computer systems including notifications that one project team member, via his associated computer system, has updated or added information contained within the central database. Business rules can be applied to these notifications to assist an organization in managing the various changes on a project. Additionally, the computer system facilitates information transfer between various distinct computer systems.

In one embodiment, the present invention provides a host computer system which is in data communication with a central database. A central database may store information predetermined to be important to one or more members of the project. The host computer system is also in data communication with first and second databases. First and second computer systems are in data communication with first and second databases, respectively. The first database is configured to store data received from the first computer system. The host computer system is configured to monitor a plurality of transactions to the first database. Each of the transactions stores data in the first database. The monitoring of the host computer system includes comparing the plurality of transactions against a predetermined transaction. If the host computer detects a match between one of the plurality of transactions to the first database and the predetermined transaction, the host computer system reads the first data from the data base and stores the first data in either the first database or the central data base, or both. Additionally, the computer system, in response to detecting the match, generates an electronic message indicating that the first database has been updated with the first data. Thereafter, the host computer system transmits the message to the second computer system in data communication with the host computer system.

BRIEF DESCRIPTION OF THE DRAWINGS

FIG. 7 is a table used by the invention shown in FIG. 3 to detect predetermined translations;

Figure 1:
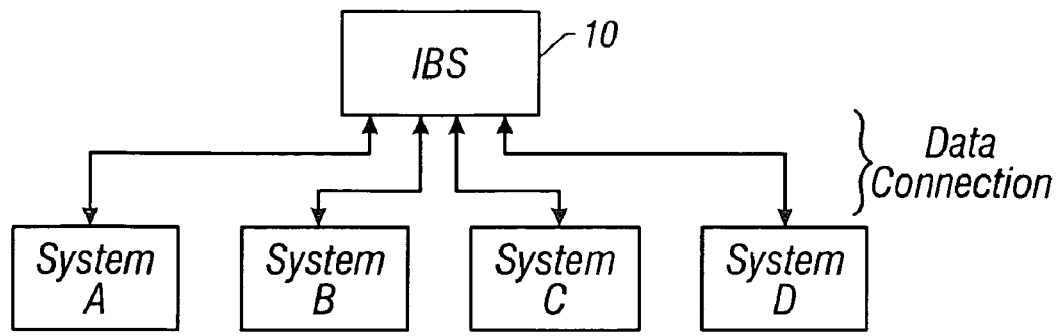
FIG. 1 is a block diagram illustrating one embodiment of the present invention in data communication with several remotely located computer systems.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DESCRIPTION OF THE PREFERRED EMBODIMENT(S)

FIG. 1 illustrates an Integrated Business System (IBS) 10 implementing the present invention. In the embodiment shown in FIG. 1, the IBS is coupled to or in data communication with additional computer systems A through D via a data link, for example an Internet data link, to enable remote communication between the IBS and computer systems A through D. It is to be understood, however, that the present invention may enable communication between the IBS and computer systems A through D via a local or intranet data link. Computer systems A through D run distinct software tools that, without the IBS, are incapable of effectively communicating with each other.

Figure 2:
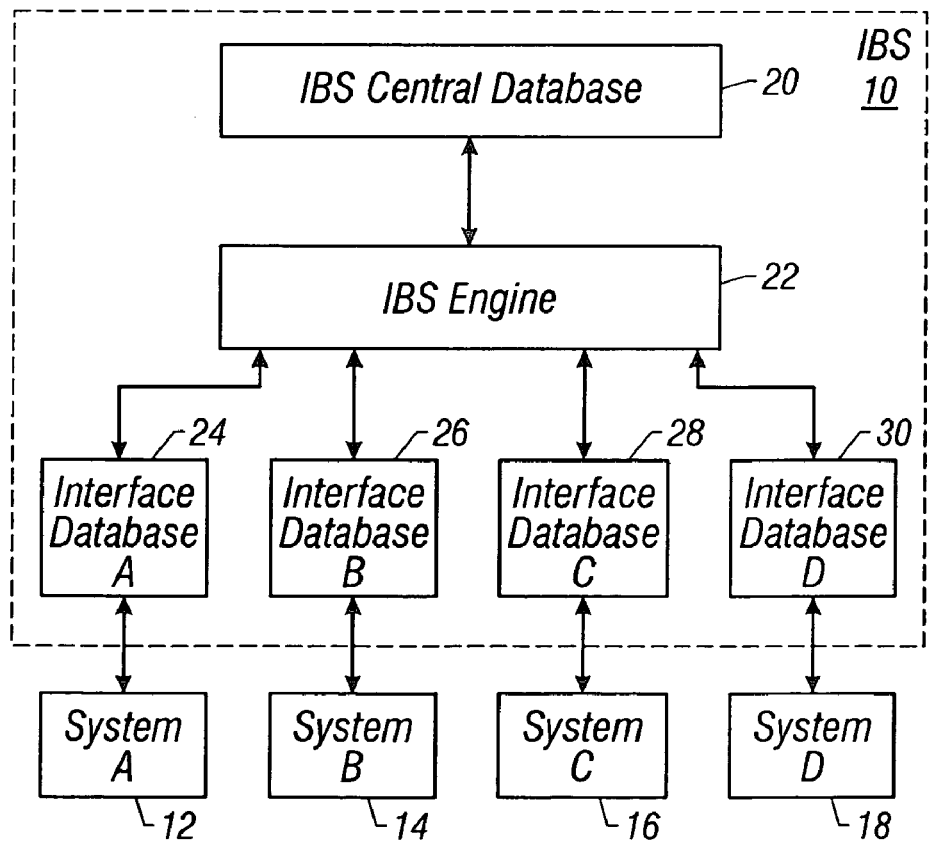
FIG. 2 shows one embodiment of the present invention shown in FIG. 1.

FIG. 2 shows one embodiment of the IBS 10 of FIG. 1. More particularly, the IBS shown in FIG. 2 includes an IBS central database 20 in data communication with an IBS engine 22 running on a host computer system which, in turn, is in data communication with IBS interface databases 24 through 30. IBS interface databases 24 through 30 are respectively in data communication with systems A through D. The present invention will be described with reference to an IBS 10 for use in the building construction industry, it being understood that the present invention is employable in other industries where several participants or collaborators with distinct roles (e.g. project design, project engineering, project management, etc.) employing distinct software tools, are needed to design and build a physical entity.

The term "computer system" as used herein generally describes the hardware and software components that in combination allow the execution of computer programs. The computer programs may be implemented in software, hardware, or a combination of software and hardware. A computer system's hardware generally includes a processor, memory media, and Input/Output (I/O) devices. As used herein, the term "processor" generally describes the logic circuitry that responds to and processes the basic instructions that operate a computer system. The term "memory medium" includes an installation medium, e.g., a CD-ROM, or floppy disks; a volatile computer system memory such as DRAM, SRAM, EDO RAM, Rambus RAM, etc.; or a non-volatile memory such as optical storage or a magnetic medium, e.g., a hard drive. The term "memory" is used synonymously with "memory medium" herein. The memory medium may comprise other types of memory or combinations thereof. In addition, the memory medium may be located in a first computer in which the programs are executed, or may be located in a second computer that connects to the first computer over a network. In the latter instance, the second computer provides the program instructions to the first computer for execution. In addition, the computer system may take various forms, including a personal computer system, mainframe computer system, workstation, network appliance, Internet appliance, personal digital assistant (PDA), television system or other device. In general, the term "computer system" can be broadly defined to encompass any device having a processor that executes instructions from a memory medium.

Figure 3:
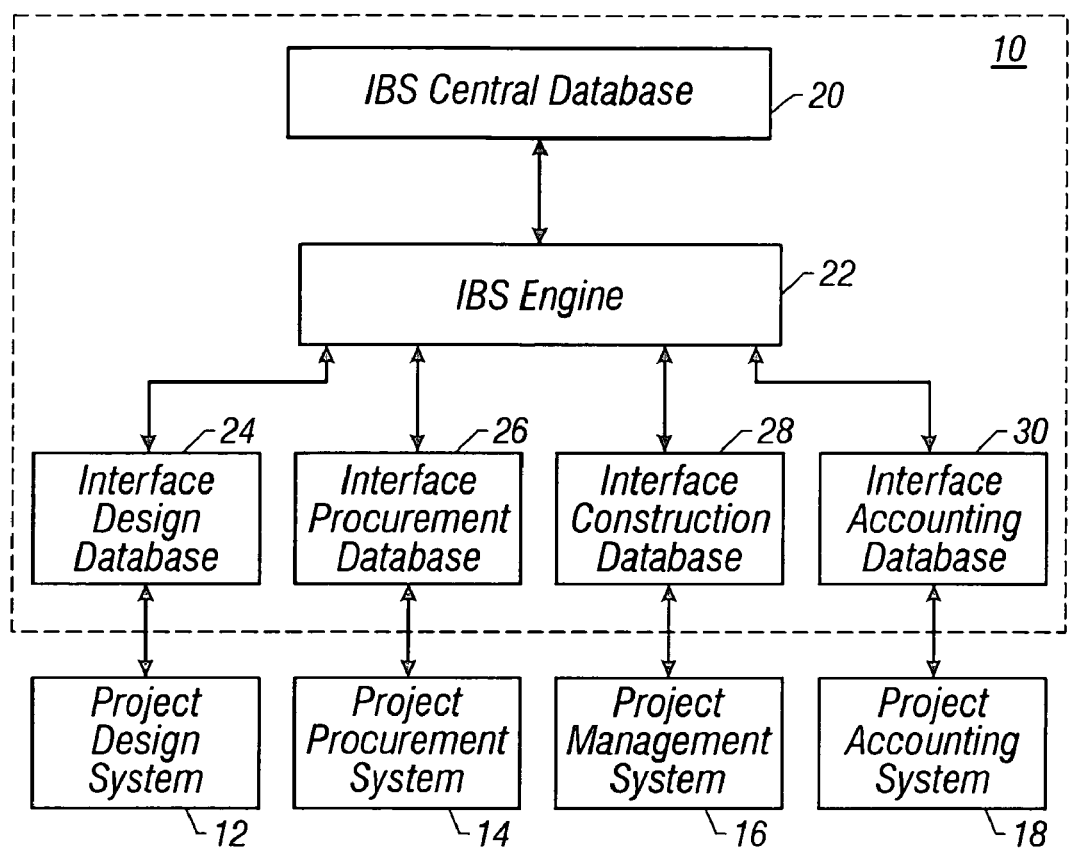
FIG. 3 shows an architecture, engineering and construction inductry embodiment of the present invention shown in FIG. 2.

FIG. 3 shows an IBS 10 configured for use in the design and construction of a building such as a hotel/casino. More particularly, as shown in FIG. 3, IBS 10 includes an IBS architectural and/or interior design interface database 24, an IBS procurement interface database 26, an IBS construction interface database 28, and an IBS accounting interface database 30. Each of these interface databases is in data communication with a respective industry-available software system. More particularly, the IBS design interface database 24 is in data communication with an industry-available construction design system 12, the IBS procurement interface database 26 is in data communication with an industry-available procurement system 14, the IBS construction interface database 28 is in data communication with an industry-available construction management system 16, and the IBS accounting database 30 is in data communication with an industry-available construction accounting system 18.

Figure 6:
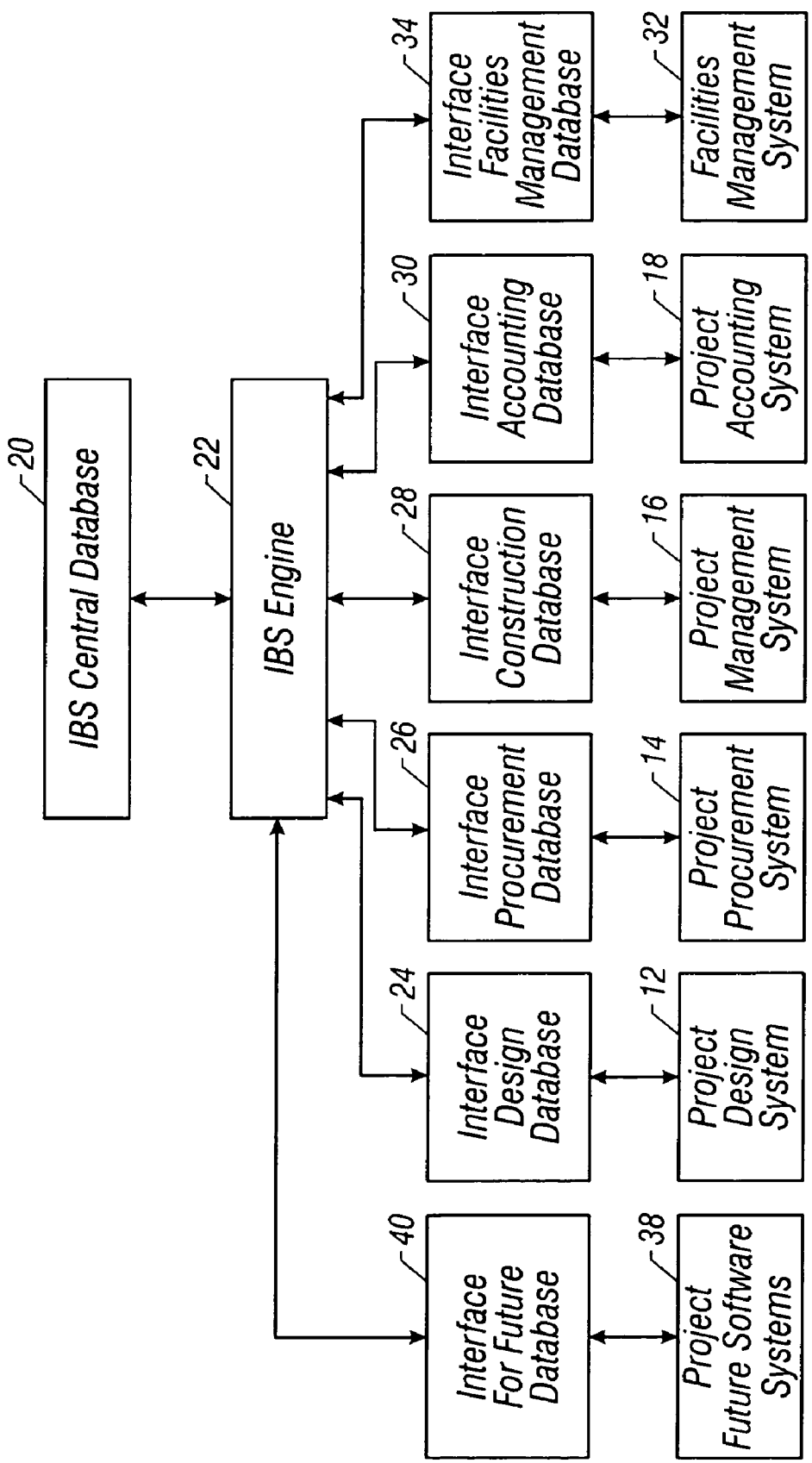
FIG. 6 shows still another alternative embodiment of the invention shown in FIG. 3.

The industry-available systems, as described above, run distinct software that are capable of aiding individual members of a construction design team in fulfilling their role in the building project. However, the industry-available systems are generally incapable of cross-platform communication. The IBS enables cross-platform communication between the industry-available systems. Moreover, the IBS enables a central database 20 that contains information collected from the distinct computer systems 12–18 via their respective interface databases 24–30 and the IBS engine 22. The information collected in the central database 20 is predetermined to be important to one or more of the design project team members (i.e. an architect, interior designer, construction manager, etc.). This IBS central database enables real-time access to a project database so that team members and/or others (e.g. the building owner or developer) can obtain, via Internet access, a substantially complete, accurate and up to date status of the building project. Since the IBS links the central database 20 with the various computer systems 12–18, the IBS enables efficient and quick modification of or additions to the project database without the need of paper transfer between the project team members. Moreover, the IBS alerts one or more project team members when modifications or additions that are predetermined to be important are made to the project so that the alerted project team members can react accordingly if the modifications or additions affect their role in the design and construction of the project building. Further, with reference to FIG. 6, the IBS central database, once completed in accordance with a finished construction project, can be utilized as a facility's management tool via a facilities management system 32 and a facilities management interface database 34, to enable the building owner to efficiently manage the building without the need of engineers' or architects' expertise in reviewing paper documentation thereof as was previously required. In other words, the owner or manager of a finished building can more efficiently plan building remodeling, maintenance or modifications using the developed central database 20 which contains a great amount of important data accessible via software systems. For example, if a heating system component, such as a motor, of a completed building malfunctions due to defects or general wear and tear, the completed IBS central database may be accessed to determine the specifications, placement, and manufacturer of the malfunctioning motor. By using a database of the completed building project, a replacement motor can be easily identified, purchased and installed. The system shown in FIG. 6 is not limited to use with the interface databases and corresponding software systems. Rather, the present invention envisions that the system shown in FIG. 6 may be extended to include additional interface databases and corresponding software systems needed in the future. To this end, FIG. 6 also shows a future interface database 40 coupled to a future project software system 40. The future interface database 40 and future The various systems shown in FIG. 3 including the IBS, the construction design system 12, the procurement system 14, the construction management system 16, and the construction accounting system 18, can be remotely located from each other. In this situation, the various systems can communicate via the Internet and appropriate supporting software.

Figure 4:
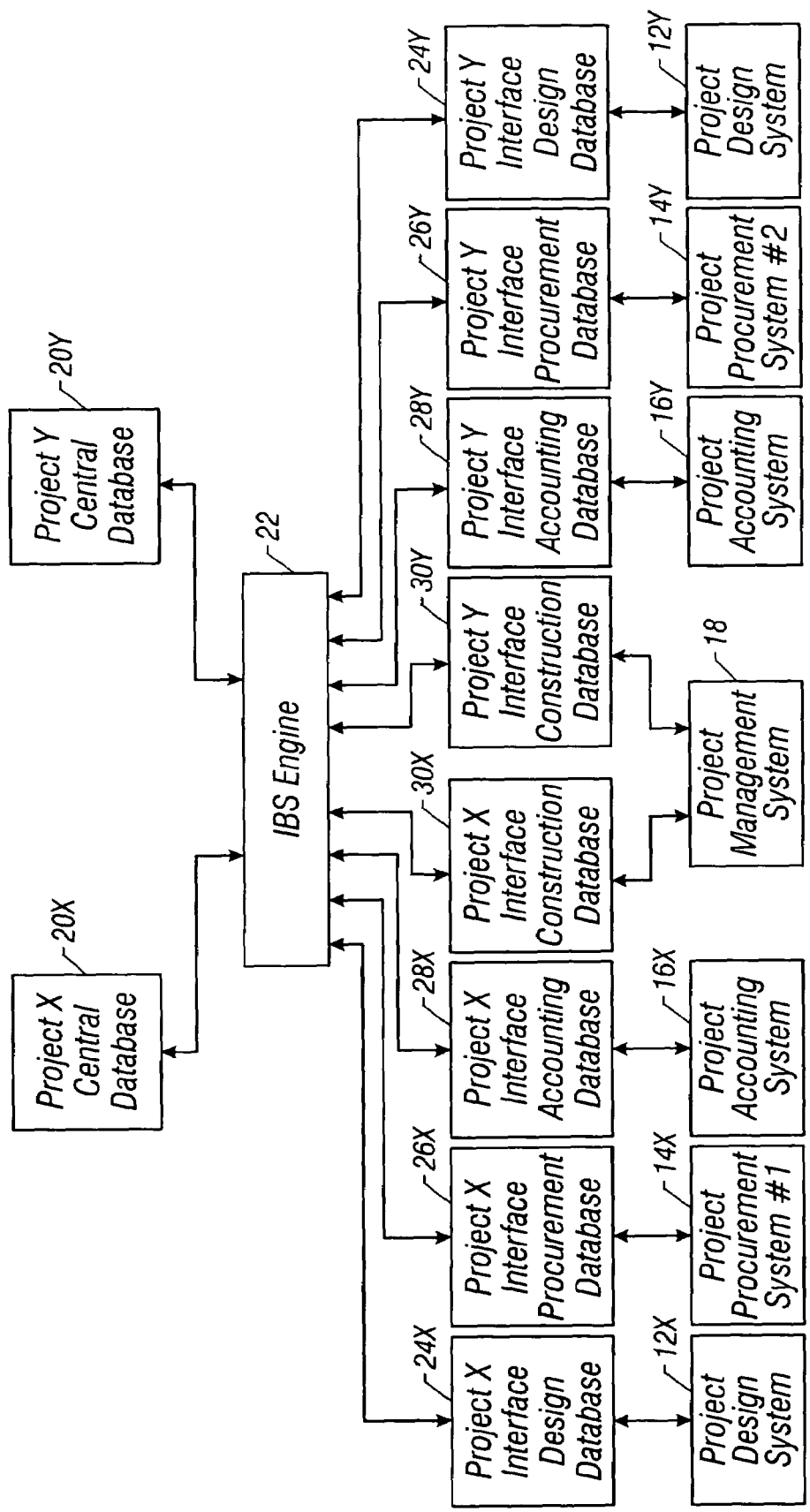
FIG. 4 shows one embodiment of the invention shown in FIG. 3.

FIG. 4 shows another embodiment of the IBS. Here, IBS 10 includes a pair of central databases 20X and 20Y in data communication with IBS engine 22. The central databases 20X and 20Y contain information relating to separate and possibly remote building projects X and Y, respectively. FIG. 4 also shows IBS including separate interface databases 24X–30X and 24Y–30Y coupled to IBS engine 22. Each of the interface databases 24X–28X and 24Y–28Y are in data communication with distinct computer systems 12X–16X and 12Y–16Y, respectively, each of which is associated distinct project team members possibly remotely located. The construction interface databases 30X and 30Y, however, are in data communication with a common construction management system 18 associated with a common construction manager. Further, procurement interface databases 26X and 26Y are in data communication with competing procurement computer systems provided by separate software vendors.

With continued reference to FIG. 3, the present invention will be described with reference to one or more simple examples. Typically in the course of a construction project, a square footage take-off of the project is calculated. A building project budget typically is based upon a square footage take-off. For example, an office building project of 5,000 square feet could have a $200.00 per square foot price associated therewith. The project could also include a restaurant with a price of $300.00 per square foot. The IBS allows electronic capturing of the project take-offs. In the past, square footage and take-offs were calculated, recorded, and transferred to project team members via paper. An architect would typically prepare an architectural specification that was forwarded to a contractor who would then manually calculate the square-footage of the office building and the restaurant. The IBS allows the architectural specification to be moved electronically from a project architect to a contractor vis-à-vis the construction design system and construction management system depicted in FIG. 3. With such efficient electronic transfer, the information needed by the contractor for calculating project square footage and take-off is instantly accessible. The information already entered by the architect is quickly and efficiently transferred to the construction management system via the IBS and can be immediately accessed by the contractor. Additionally, this information may be stored in central database 20. To further illustrate functions of the IBS, consider an interior designer who plans twenty-five chairs for an office suite. In the past, a project procurement agent of the project would, typically, need to obtain and review the interior designer's paper specifications and, in this example, count the number of chairs requested. The IBS specifies and electronically counts the number of chairs identified for a project, and electronically transfers this information via the IBS to, for example, a procurement system, as shown in FIG. 3. Information is immediately available to the project team members via the IBS. Thus, the contractor may electronically review the current twenty-five chair specification for a particular office suite and may decide that the number of office chairs should be increased to allow for the possibility that some chairs might be damaged in shipping. Thus, in this example, the contractor, via the construction management system, may access the IBS and increase the number of office chairs specified for an office suite. The initial specification of the office chairs by the interior designer may be stored in the central database 20 for review. Additionally, each modification to the number or placement of the originally specified office chairs may be stored in the central database 20 for subsequent review.

Project team members, or others associated with the project such as the project developer or owner, may review the contents of a particular project via project collaboration software which may be separate from or integrated into each team member's specific software system. Such project collaboration software communicates with the IBS central database 20. The project collaboration software may be implemented as a browser based tool which enables project team members to view project specifications and/or drawings stored within the IBS at any point during the construction project. Additionally, a central database of a completed project may be viewed by a browser based software tool thereby facilitating post construction renovations, remodeling, etc.

As shown in FIG. 3, the various industry-available software systems 12–18 are in data communication with corresponding IBS interface databases 24–30. The IBS central database 20 stores critical project information, information which is predetermined to be particularly important to one or more project team members. When a team member wishes to add or modify a project feature via his respective computer system, thereby changing project information, the new or modified information is received and first stored in a respective IBS interface database. For example, should an architect seek to modify an architectural design specification, the change is first entered into the IBS design interface database 24. IBS engine 22 monitors the various interface databases 24–30 looking for changes which are predetermined to be important and which are entered therein by respective systems 12–18. IBS engine 22 employs one or more preprogrammed data collection agents to monitor the changes entered into the interface databases 24–30. Upon detection of a change that is predetermined to be important, IBS engine 22 generates a message notifying all or select project team members of the change. Additionally, as will be more fully described below, IBS engine 22 issues a request for approval of the change if required. In one embodiment, the request for approval is routed to, for example, a project manager. IBS engine 22 may update the IBS central database 20 of the project in accordance with the change entered into an interface database. In one embodiment, the IBS central database is updated prior to approval from a project manager or other with authorization to approve or reject such changes. In an alternative embodiment, approval must be obtained before the central database is updated with the change.

Lastly, IBS engine 22 may forward information of the changes to other project team members for whom the project change is relevant.

Figure 5:
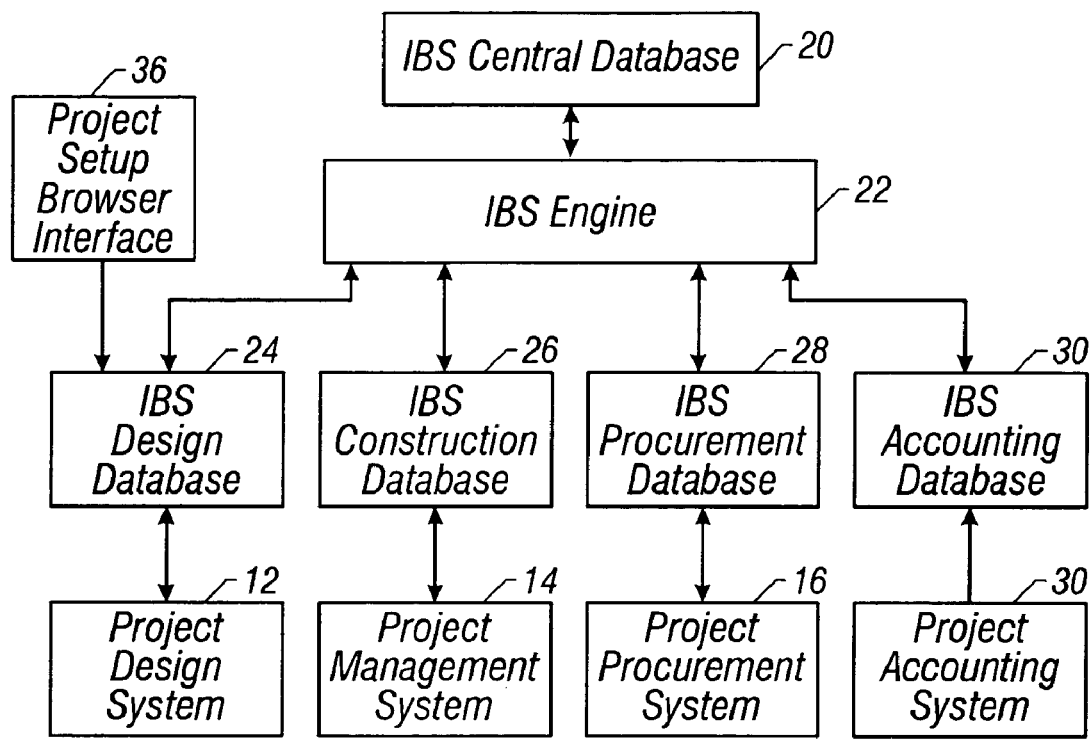
FIG. 5 shows another embodiment of the invention shown in FIG. 3.

Initially the IBS central database and the interface databases are set up for a new construction project via a browser interface. Additionally, the IBS engine may be preprogrammed via the browser interface with specific rules that guide the design, engineering, and execution of a project. FIG. 5 shows the system of FIG. 3 with a project setup browser interface 36 that enables database set up and/or preprogramming of the IBS engine. For example, with respect to preprogramming, the IBS engine may be configured to include predetermined rules for routing information in a serial fashion between participants of the project. If a change or addition is made to a specification or drawing by the architect, for example, each of the project engineers collaborating on the project are provided with notice of the change in a serial fashion so that each project engineer may, in serial fashion, modify the change or addition to the project. Modifying changes or additions to the project in a serial fashion avoids modifications which are inconsistent with each other. If, however, it is determined that a particular project would prefer a parallel distribution of project changes or additions by an architect, the rules of the IBS engine may be modified during system setup.

With continued reference to FIG. 5, browser interface 36 may also be used to initiate a new project database or an interface database corresponding to a particular phase or component of a project. In other words, a given project team member may initiate an interface database corresponding to a project using the browser interface. For a new project, IBS also sets up central database 20. Again, IBS central database 20 is a collection of data that is predetermined to be important and that can be shared among the various project team members. In setting up an interface database, a team member enters important information such as the client name, the project location, a job number associated with the particular team member, etc. into the browser interface. In response, an interface database is set up which can begin collecting information inputted thereto by the particular team member vis-à-vis his system. When other project team members create additional interface databases, these interface databases are linked so that various team members can share information via electronic transfer. Thus, an architect may create a design interface database 24 for a particular project prior to a contractor creating an IBS construction interface database 28. However, once the IBS construction database 28 is created, information contained in the IBS design interface database 24 may be transferred automatically into the IBS construction interface database 28 vis-à-vis the IBS engine 22.

As noted above, the IBS engine 22 monitors the interface databases looking for new information added thereto, be it new design information, new procurement information, new accounting information, etc. This information, if predetermined to be important, is routed along with a notification to one or more project team members. The notification may be routed by many different means, including Email notification. As noted above, data collection agents within the IBS engine 22 monitor the various interface databases seeking information predetermined to be important to one or more project team members.

Depending on the IBS configuration, authorized users (e.g., a project manager) can approve or reject the change and trigger appropriate notices. The following example more fully describes the process by which a change to the central database is approved or rejected. Suppose a designer, operating through his project design system, enters a change to an existing specified item of the project. The central database is updated with the new specified item in accordance with the change entered by the designer. IBS engine detects the change entered by the designer, and accesses a table to determine if the change is one that requires approval from, for example, a project manager. If the change is not one that requires approval, the process ends, and the central database is maintained with the new specified item. If however the change to the previously specified item requires approval, a message is generated and routed to the appropriate authorizing entity (e.g., the project manager) requesting approval of the change. Upon receipt of the message, the appropriate authorizing entity approves or rejects the change to the item specified. If approved, the designer is notified accordingly. Additionally, the originally specified item, if purchased, may be returned to the vendor who originally sold it to the project and a refund may be sought. If, however, the change is rejected, the designer is notified accordingly, and the central database reverts to its original state that includes the originally specified item.

Figure 8:
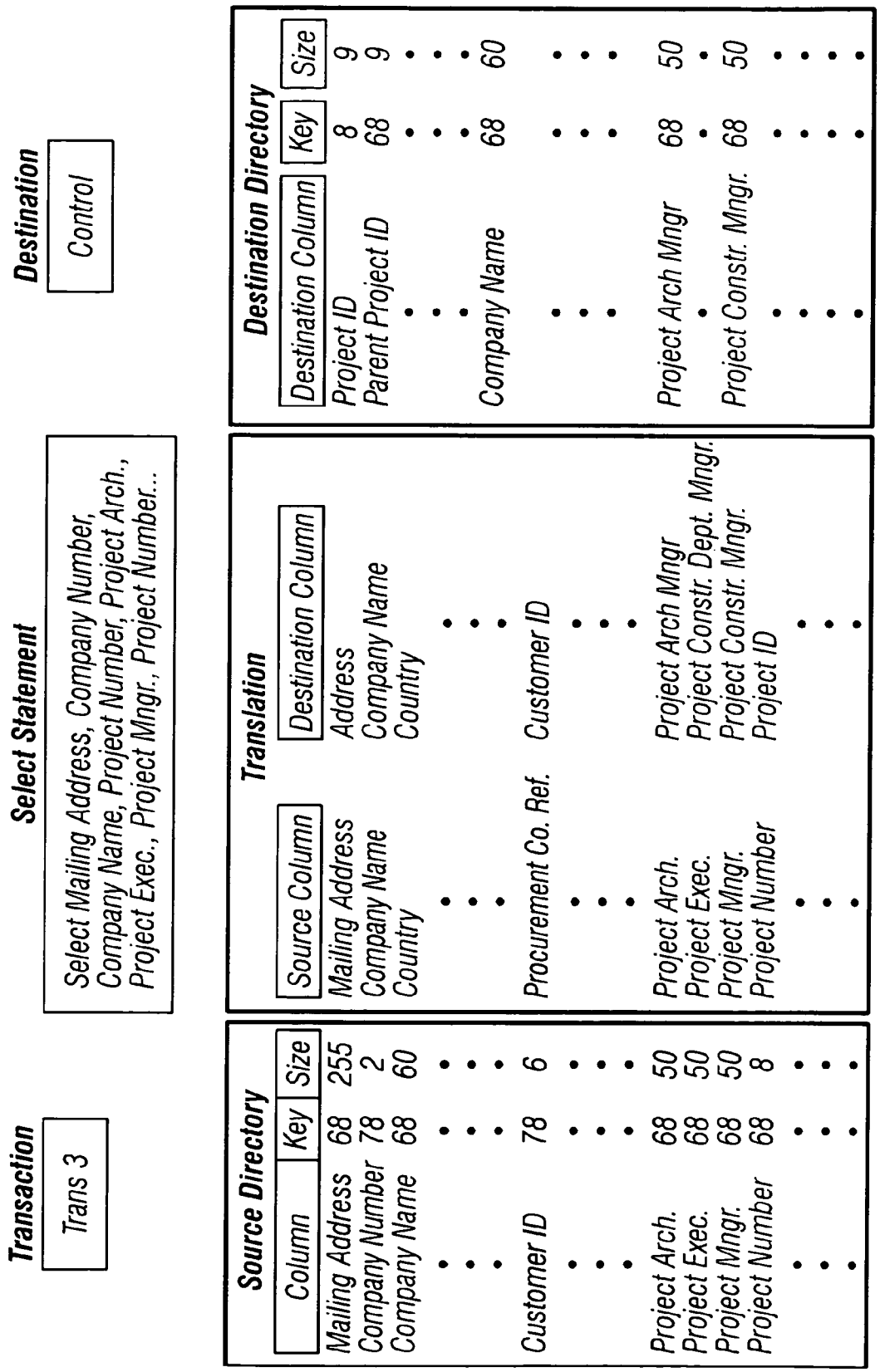
FIG. 8 is a routing table illustrating how one exemplary transaction shown in FIG. 7 is translated between a source database and a destination database.
Figure 9:
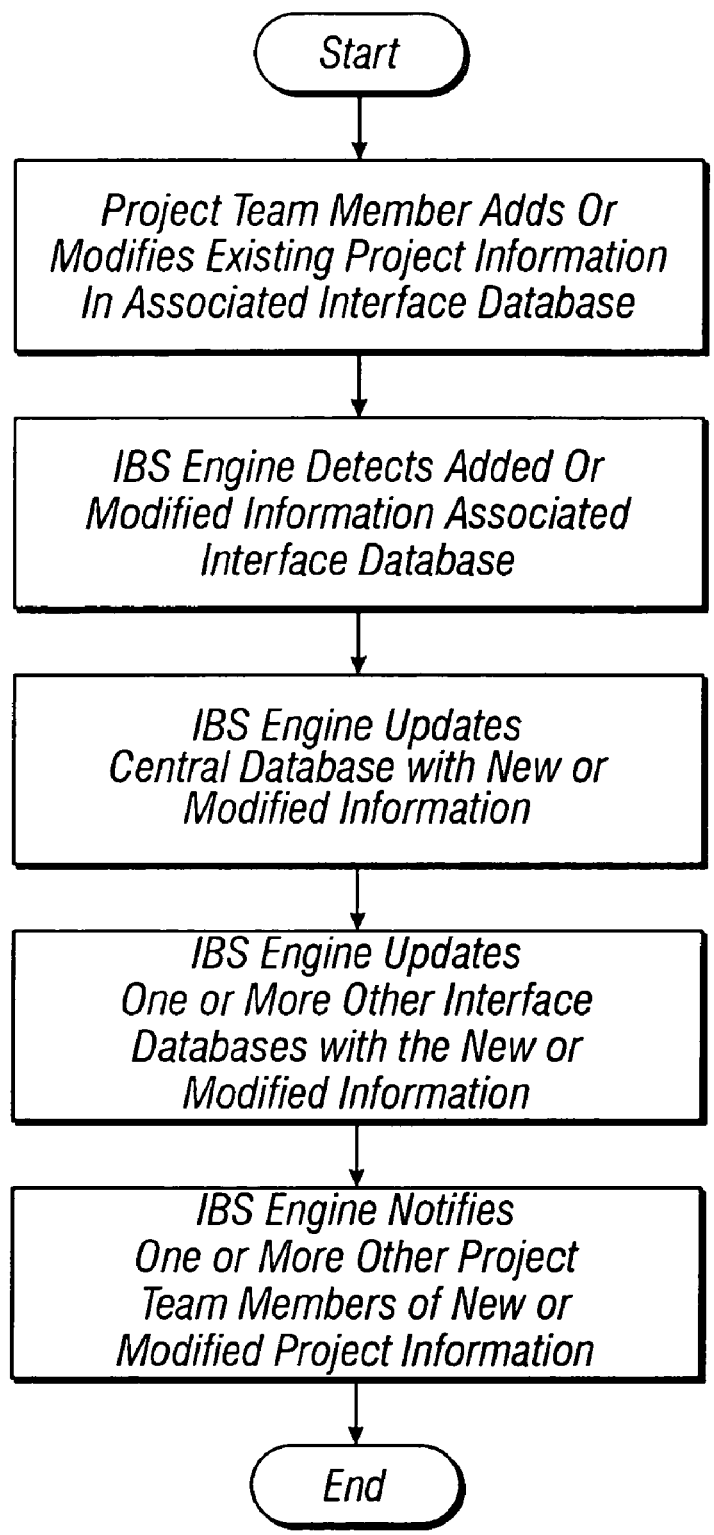
FIG. 9 is a flow chart illustrating operational aspects of the present invention.

FIGS. 7 and 8 illustrate one embodiment by which the data collection agents of the IBS engine 22 are programmed to monitor the interface databases 24–30. In this configuration, a list of transactions that the preprogrammed data collection agents monitor, is identified in FIG. 7. A transaction is an event whereby a project team player, via one of the systems 12–18, updates a respective interface database 24–30 by adding new project information or modifying existing project information.

When new data reaches an interface database, a bit associated with the new or modified data is toggled so that the data collection agents can detect a new entry therein. If the transaction is predetermined to be important (is listed in the list of transactions set forth in FIG. 7), the IBS engine may initiate a translation and a routing of the translated data to an appropriate destination. Such destination may include the IBS central database 20 and/or one of the interface databases 24–30. FIG. 8 shows the translation and routing mechanism for one of the transaction entries shown in FIG. 7. For example, if the IBS engine detects Transaction 3 which occurs, for example, in IBS design interface database 24, the IBS engine performs a translation and routing of that data in the interface database 24 to the procurement interface database 26. The translation table shown in FIG. 8 facilitates a mapping between the source directory and the destination directory shown in FIG. 8 so that appropriate data of Transaction 3, the interface database location of which is pre-identified in the select statement box can be properly routed to its correct destination.

To illustrate further, Transaction 3, as shown in FIG. 8, may represent an interior designer's modification of the number of chairs to be placed in an office suite of a particular design construction project. Once the interior designer makes a modification to the design interface database 24 (shown in FIG. 3) vis-à-vis the construction design system 12, a data collection agent of the IBS engine 22 subsequently detects the modification to design interface database 24, and initiates notification to the procurement system 14 of a change in the number of office chairs to be purchased. The new information is translated and routed to the procurement interface database 26. Additionally, the new information is translated and routed to the central database according to the translation set forth in FIG. 8 so that the central database 20 is up to date.

Various embodiments of the present invention may be implemented in accordance with computer executable instructions on a carrier medium. Suitable carrier media include memory media or storage media such as magnetic or optical media, e.g., disk or CD-ROM, as well as signals such as electrical, electromagnetic, or digital signals, conveyed via a communication medium such as networks and/or a wireless link.

Although the system and method of the present invention have been described in connection with several embodiments, the invention is not intended to be limited to the specific forms set forth herein, but on the contrary, it is intended to cover such alternatives, modifications, and equivalents as can be reasonably included within the spirit and scope of the invention as defined by the appended claims.

What is claimed is:

1. A method for managing the design and building of a construction project, the method being executable by a host computer system, comprising:

receiving a first type of software application data for the construction project into a central database via a first interface database, the first type of software application data input by a first project collaborator into a first type of software application program running on a first computer system;

receiving a second different type of software application data for the construction project into the central database via a second interface database, the second type of software application data input by a second project collaborator into a second software application program, the second application program of a different type running on a second computer system;

generating a first message indicating a modification of the first data; and transmitting the first message to the second computer system;

wherein said first type of software application program and second type of software application program each comprise at least one of a computer aided design software application, a design database application, a procurement application, a facilities management application, or an accounting application;

monitoring a plurality of transactions to the first interface database, wherein each of the plurality of transactions store data in the first interface database, wherein monitoring the plurality of transactions comprises comparing the plurality of transactions against a predetermined transaction;

detecting a match between one of the plurality of transactions to the first database and the predetermined transaction;

generating said first message wherein said first message indicates that the first type of software application data has been stored in the first database by the one of the plurality of transactions; and transmitting the first message to the second computer system.

2. The method of claim 1 wherein the method further comprises:

reading the first type of software application data stored in the first interface database in response to the host computer detecting the match;

translating the first type of software application data into translated first data in response to the host computer detecting the match;

storing the translated first type of data into another interface database in data communication with the host computer system in response to the host computer detecting the match.

3. A method for managing the design and building of a construction project, the method being executable by a host computer system, comprising:

receiving a first type of software application data for the construction project into a central database via a first interface database, the first type of software application data input by a first project collaborator into a first type of software application program running on a first computer system;

receiving a second different type of software application data for the construction project into the central database via a second interface database, the second type of software application data input by a second project collaborator into a second software application program, the second application program of a different type running on a second computer system;

generating a first message indicating a modification of the first data; and transmitting the first message to the second computer system;

wherein said first type of software application program and second type of software application program each comprise at least one of a computer aided design software application, a design database application, a procurement application, a facilities management application, or an accounting application;

monitoring a plurality of transactions to a first interface database, wherein each of the plurality of transactions store data in the first interface database, wherein monitoring the plurality of transactions comprises comparing the plurality of transactions against a predetermined transaction;

detecting a match between one of the plurality of transactions to the first interface database and the predetermined transaction;

reading the first type of software application data stored in the first interface database in response to the host computer detecting the match;

translating the first type of software application data into translated first data in response to the host computer detecting the match;

storing the translated first type of data into another interface database in data communication with the host computer system in response to the host computer detecting the match.

4. The method of claim 3 wherein the method further comprises:

generating a message indicating that first type of software application data has been stored in the first interface data base by the one of the plurality of transactions;

transmitting the message to a second computer system in data communication with the host computer.

5. A method operating on a host computer system coupled to the Internet to manage the design and building of a construction project, comprising:

storing first data received from a first computer system in a database, wherein the first computer system operates at least a first type of application software and provides computer aided design data input by a first project collaboration comprising construction project objects of a first type;

generating a first message corresponding to a request to approve or reject storing the first data in the database;

transmitting the first message to a second computer system, wherein the second computer system is in data communication with the host computer system and the database and operates at least a second type of application software providing construction project objects of a second type, input by a second project collaboration, wherein said first and second type of application software comprises any of at least one of a design database application, a procurement application, a facilities management application, or an accounting application;

the second computer system generating a second message corresponding to an approval or rejection of storing the first data in the database; and removing the first data from the database if the second message corresponds to the rejection of storing the first data in the second database, or maintaining the first data in the second database if the second message corresponds to the approval of storing the first data in the database;

monitoring a plurality of transactions to the database, wherein each of the plurality of transactions store data in the database, wherein monitoring the plurality of transactions comprises comparing the plurality of transactions against a predetermined transaction;

detecting a match between one of the plurality of transactions to the database and the predetermined transaction;

reading second data stored in the database in response to the host computer detecting the match between one of the plurality of transactions to the database and the predetermined transaction;

translating the second data into translated second data in response to the host computer detecting the match; and storing the translated second data into another database in data communication with the host computer system in response to the host computer detecting the match between one of the plurality of transactions to the database and the predetermined transaction.

6. The method of claim 5 wherein the another database stores data specifying components of a project to be built.

* * * * *